United States Patent
Ho et al.

(10) Patent No.: US 7,614,774 B2
(45) Date of Patent: Nov. 10, 2009

(54) LED AND LED-APPLIED BACKLIGHT MODULE

(75) Inventors: Hsin-Hua Ho, Hsin-Chu Hsein (TW); Wen-Jeng Hwang, Hsin-Chu Hsein (TW)

(73) Assignee: Lighthouse Technology Co., Ltd., Hsin-chu Hsein (TW)

( * ) Notice: Subject to any disclaimer, the term of this patent is extended or adjusted under 35 U.S.C. 154(b) by 11 days.

(21) Appl. No.: 11/712,582

(22) Filed: Mar. 1, 2007

(65) Prior Publication Data

US 2008/0186733 A1    Aug. 7, 2008

(30) Foreign Application Priority Data

Feb. 2, 2007    (TW) .............................. 96103827 A

(51) Int. Cl.
*F21V 7/04*    (2006.01)

(52) U.S. Cl. ........................ 362/612; 362/613; 362/555; 257/100

(58) Field of Classification Search ................. 362/612, 362/800, 613, 555; 257/97–100, 81
See application file for complete search history.

(56) References Cited

U.S. PATENT DOCUMENTS

| | | | | |
|---|---|---|---|---|
| 5,161,872 A | * | 11/1992 | Sasaki et al. | 362/29 |
| 6,608,334 B1 | * | 8/2003 | Ishinaga | 257/100 |
| 6,943,433 B2 | * | 9/2005 | Kamada | 257/666 |
| 7,157,853 B2 | * | 1/2007 | Imai et al. | 313/512 |
| 7,360,937 B2 | * | 4/2008 | Han et al. | 362/608 |
| 2006/0050532 A1 | * | 3/2006 | Stadtwald-Klenke | 362/612 |
| 2007/0008739 A1 | * | 1/2007 | Kim et al. | 362/612 |

FOREIGN PATENT DOCUMENTS

JP    10247412    *    9/1998

* cited by examiner

*Primary Examiner*—Sandra L O'Shea
*Assistant Examiner*—Evan Dzierzynski
(74) *Attorney, Agent, or Firm*—Troxell Law Office PLLC

(57) ABSTRACT

A light emitting diode includes two lead-frames, one or a plurality of light emitting chip, a casing, and a packaging colloid; the casing comprised of two pairs of a first and a second side units to surround a compartment; the first side unit being higher than the second side unit; the packaging colloid being received in the compartment; and the packaging colloid protruding from the casing to indicate a convex so to change angle of incidence of the light after leaving the packaging colloid and to improve light use efficiency and light emitting angle.

20 Claims, 12 Drawing Sheets

LED AND LED-APPLIED BACKLIGHT MODULE

BACKGROUND OF THE INVENTION (a) Field of the Invention

The present invention is related to a light emitting diode construction, and more particularly, to one that improves light use efficiency, increases light emitting angle, and a backlight module applying the light emitting diode to upgrade its light emitting efficiency.

(b) Description of the Prior Art

An Surface Mounted Device (SMD) light emitting diode 1 of the prior art as illustrated in FIGS. 1 and 2 of the accompanying drawings includes a casing 11 disposed with two first sides and two second sides 111 and 112 opposite to each other; a compartment 113 defined by both sides 111 and both sides 112; a light emitting chip 12 being received at the bottom of the compartment 113 wherein two lead-frames 13 and 14 are also accommodated to respectively define two soldering portions 131 and 141; the light emitting chip 12 being respectively electrically connected to both soldering portions 131 and 141 by means of leading wires 15; and a packaging colloid 16.

However, the packaging colloid 16 in the compartment 113 has a flat surface and a total reflection is produced when the reflectivity of the packaging colloid 16 is 1.41 and the angle of incidence of the light emitted from the light emitting chip 12 entering into the packaging colloid 16 is greater than 45° indicating the light is prevented from leaving the packaging colloid 16. When the light is totally reflected by the packaging colloid 16 or is reflected from the bottom of the packaging colloid 16 to both sides 111 and 112 of the casing 11, the light is confined in the packaging colloid 16 with certain portion of the light will produce further total reflection to prevent light from effectively leaving the packaging colloid thus to compromise use efficiency of light.

SUMMARY OF THE INVENTION

The primary purpose of the present invention is to provide a light emitting diode construction that is capable of improving use efficiency of light and increasing light emitting angle for the light emitting diode to be optimally applied in a backlight module to promote upgrading light emitting efficiency.

To achieve the purpose, a light emitting diode of the present invention includes two lead-frames, one or a plurality of light emitting chip, a casing, and a packaging colloid. Wherein, the casing includes a first side unit and a second side unit arranged opposite to each other; a compartment being defined by both side units with the first side unit higher than the second side unit; and the packaging colloid being received in the compartment. When light emitted from the light emitting chip is reflected to the second side unit, the light will not be reflected by the second side unit any more thus to increase light emitting angle. Furthermore, the packaging colloid is made projecting from the casing to indicate a convex surface to change the incidence angle of the light while leaving the packaging colloid thus to upgrade the use efficiency of the light.

DETAILIGHT EMITTING DIODE DESCRIPTION OF THE PREFERRED EMBODIMENTS

Figure 1:
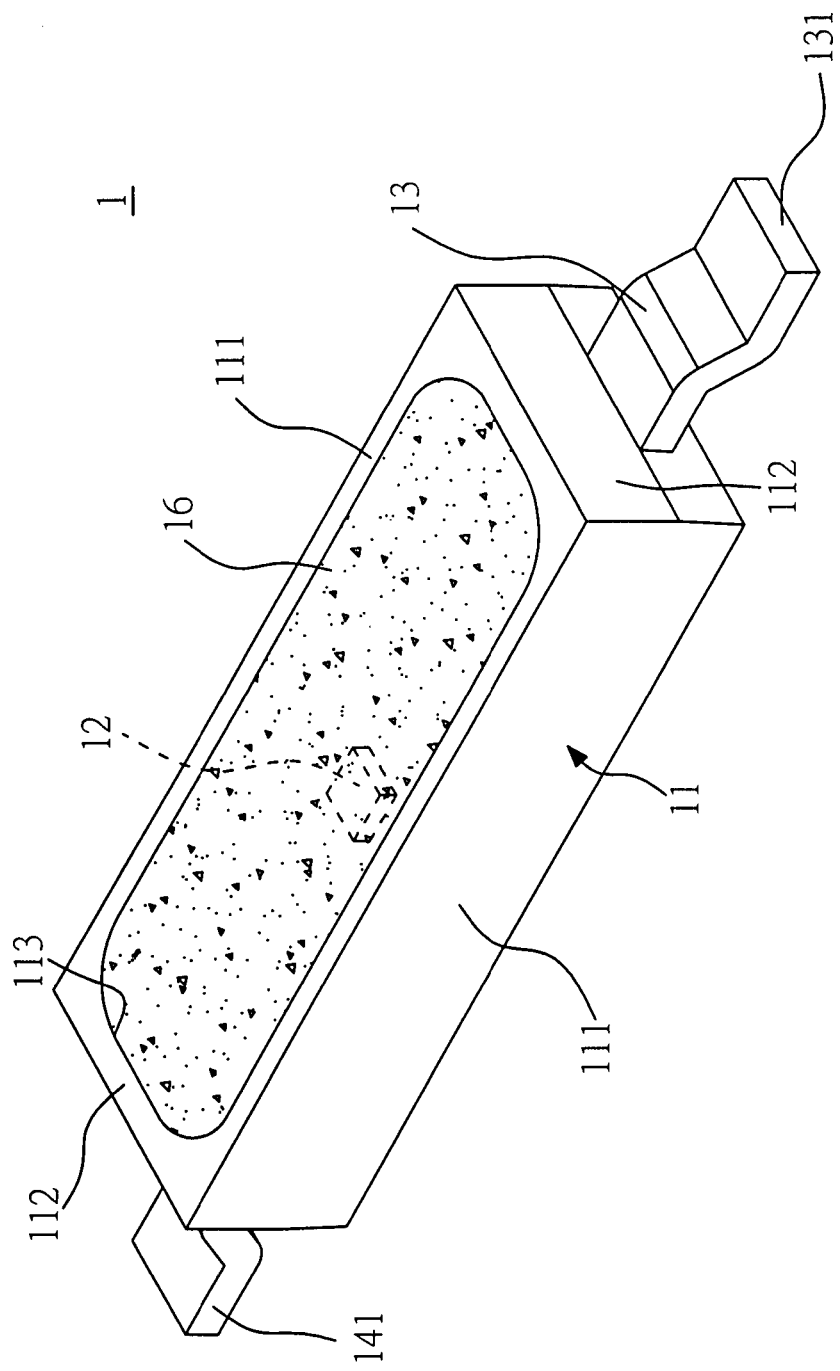
FIG. 1 is a perspective view showing a construction of a light emitting diode of the prior art.
Figure 2:
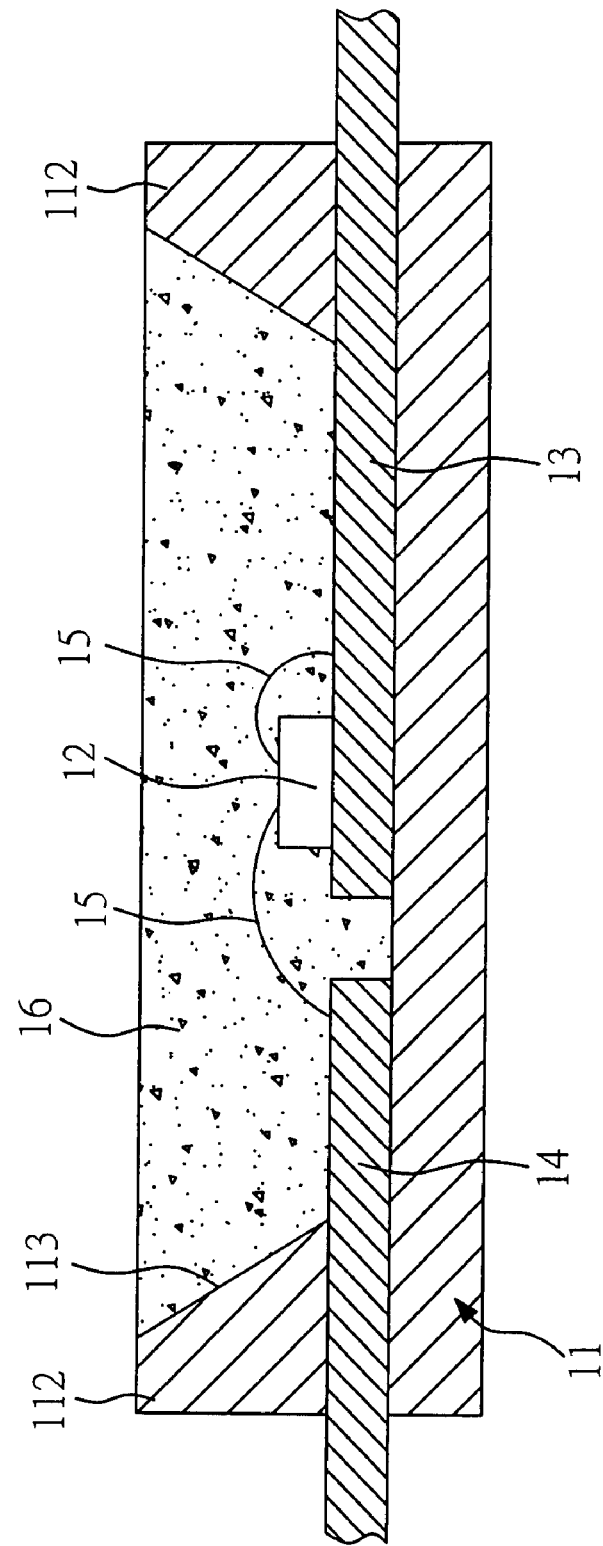
FIG. 2 is a schematic view showing the construction of the light emitting diode of the prior art.
Figure 3:
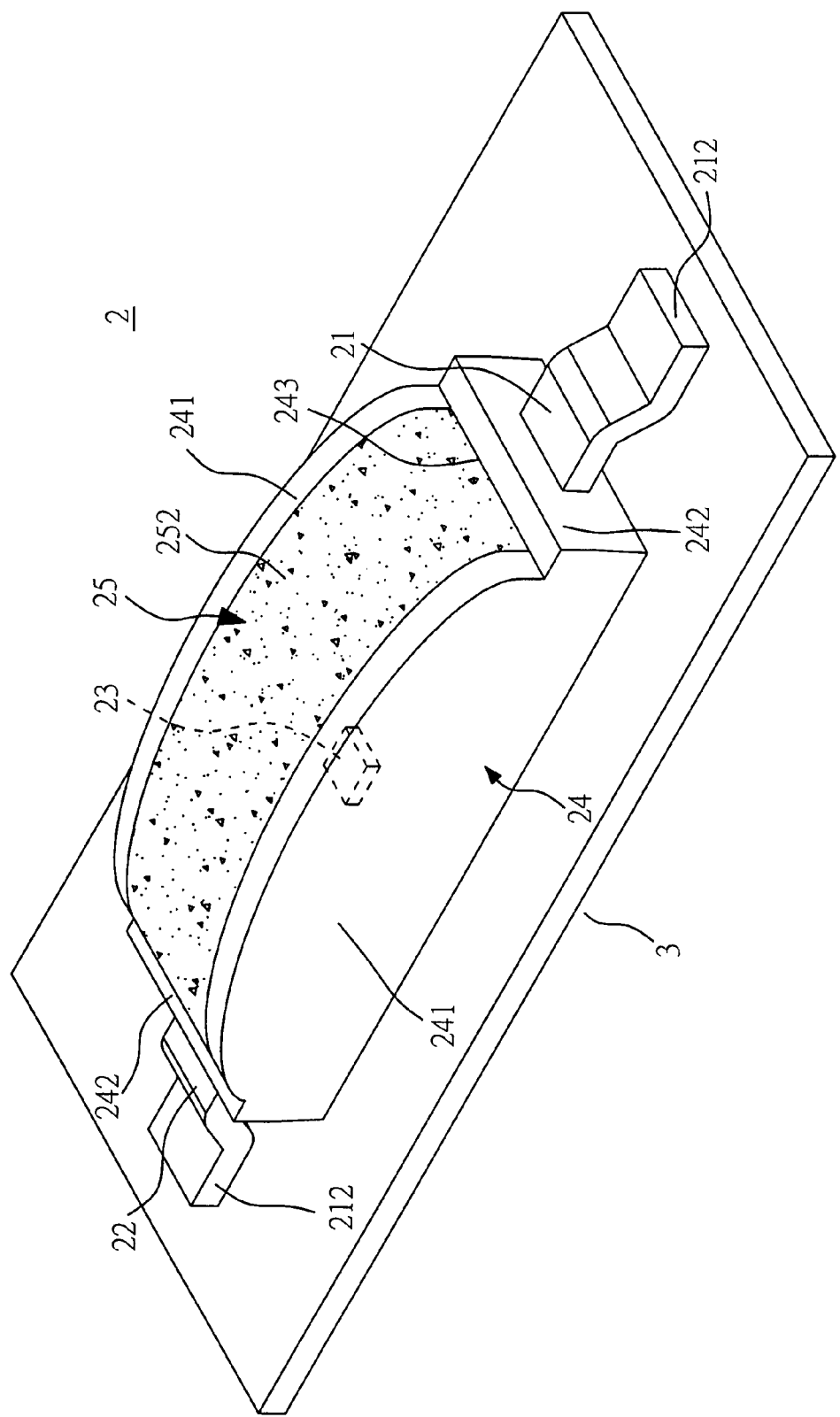
FIG. 3 is a perspective view showing a construction of a light emitting diode of the present invention.
Figure 4:
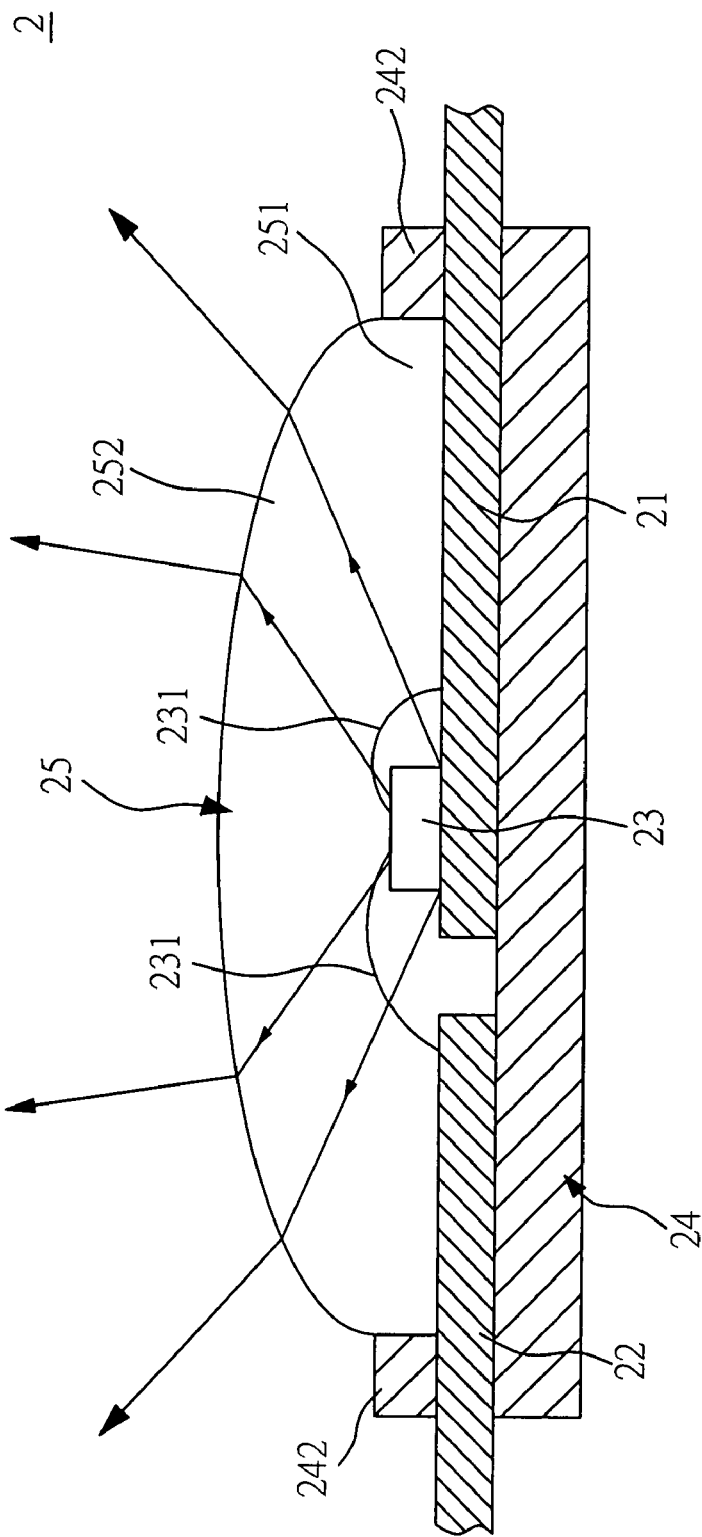
FIG. 4 is a schematic view showing the construction of the light emitting diode of the present invention.

Referring to FIGS. 3 and 4, a light emitting diode of the present invention of a light emitting diode and a backlight module thereof is comprised of a light emitting diode 2, one or a plurality of light emitting chip 23, a casing 24, and a packaging colloid 25. Wherein the light emitting diode 2 includes two lead-frames 21 and 22 with the lead-frame 21 being available for the placement of a light-emitting chip 23. The light-emitting chip 23 is placed on the lead-frame 21 and electrically connected to both lead-frames 21 and 22 by means of a leading wire 231.

The casing 24 covering upon both lead-frames 21 and 22 is provided with a first side unit and a second side unit with the first side unit including two first sides 241 opposite to each other and the second side unit including two sides 242 opposite to each other. A compartment 243 is formed in a space surrounded by both pairs of the first sides 241 and the second sides 242; and the first side 241 is higher than the second side 242. As illustrated, both first sides 241 are longer sides and both second sides 242 are shorter sides to surround the compartment 243.

The packaging colloid 25 received in the compartment 243 includes a filling portion 251 and a convex portion 252. The filling portion 251 is located in the compartment 243 and the convex portion 252 projects from the casing 24. Both pairs of the first and the second sides 241 and 242 are covered on the outer side of the filling portion 251 with each first side 241 made in a contour same as that of the convex portion 252 and higher than each second side 242.

In practice, light emitted from the light-emitting chip 23 will not be reflected by either second side 242 thus to increase the light emitting angle of the light-emitting chip 23 since both shorter sides, i.e., both second sides 242 of the casing 24 are lower than both first sides 241 without challenging the scope of the convex portion 252 of the packaging colloid 25. At where the packaging colloid 25 protrudes from the casing 24 indicates a convex so to change an angle of incidence of the light entering into the packaging colloid 25 to reduce the chance of a total reflection to permit most of the light to effectively leave the packaging colloid for improving light use efficiency.

Figure 5A:
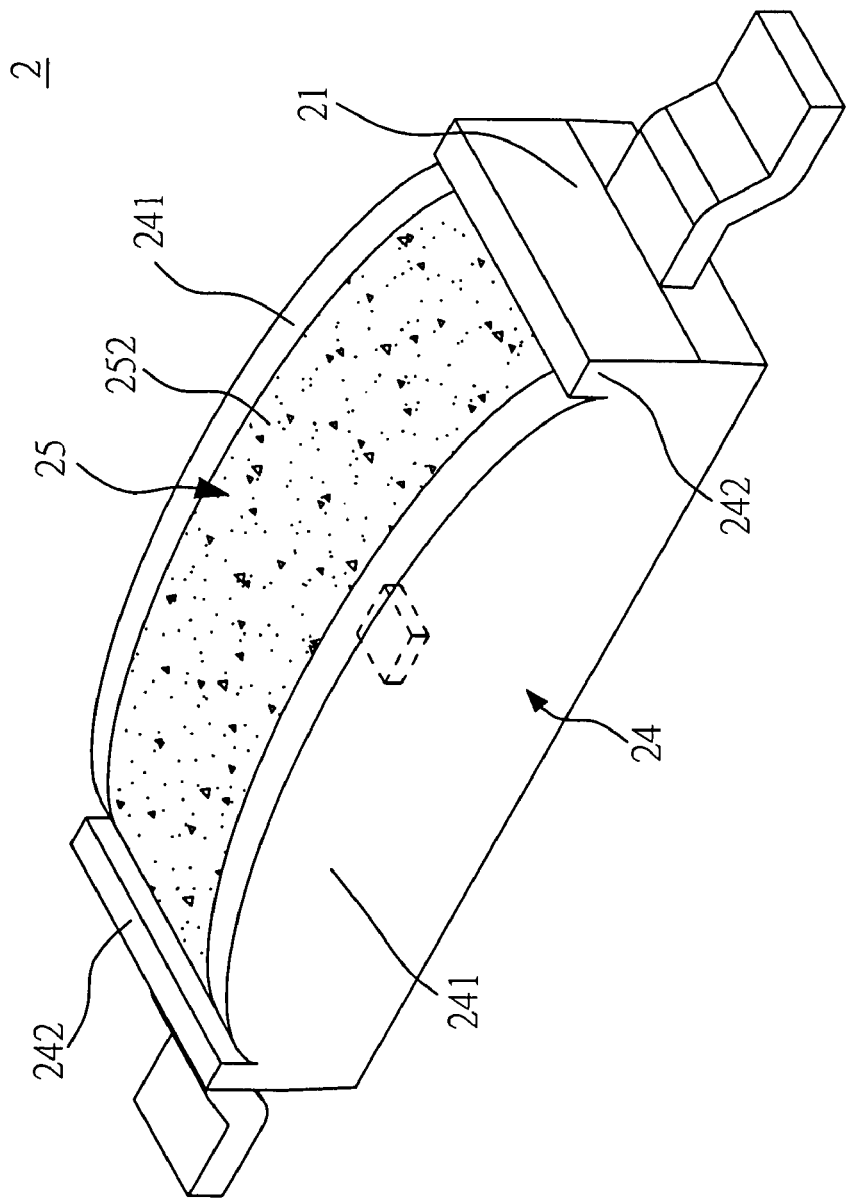
FIGS. 5(A) and 5(B) are perspective and schematic views showing another construction of the light emitting diode of the present invention.
Figure 5B:
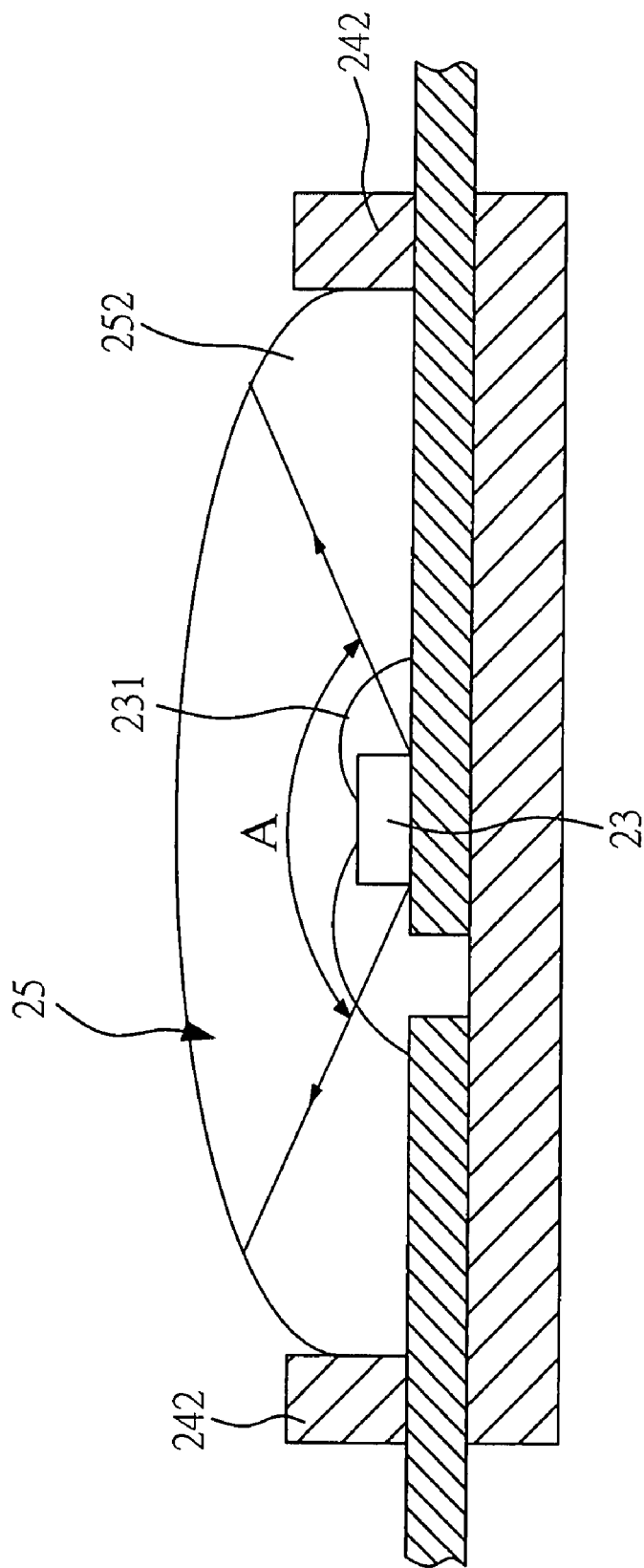

As the light-emitting chip 23 is provided with a given range A of light emitting angles, a proper height is defined by the second side 242 towards the convex portion 252 (without challenging the height of the first side 241) without falling beyond the range A of the light emitting angles as illustrated in FIGS. 5(A) and 5(B).

Figure 6:
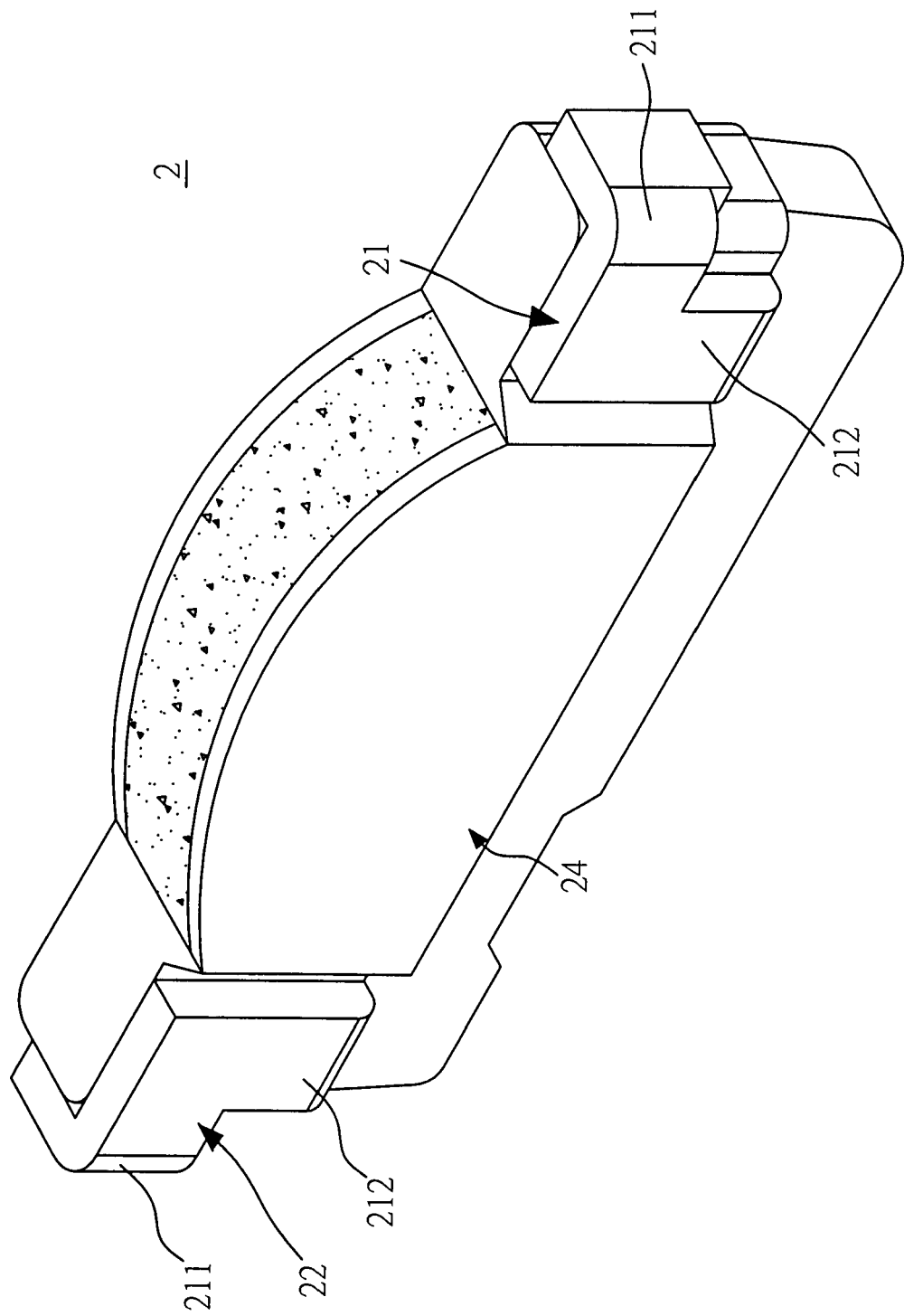
FIG. 6 is a perspective view showing a side view light emitting diode of the present invention.
Figure 7:
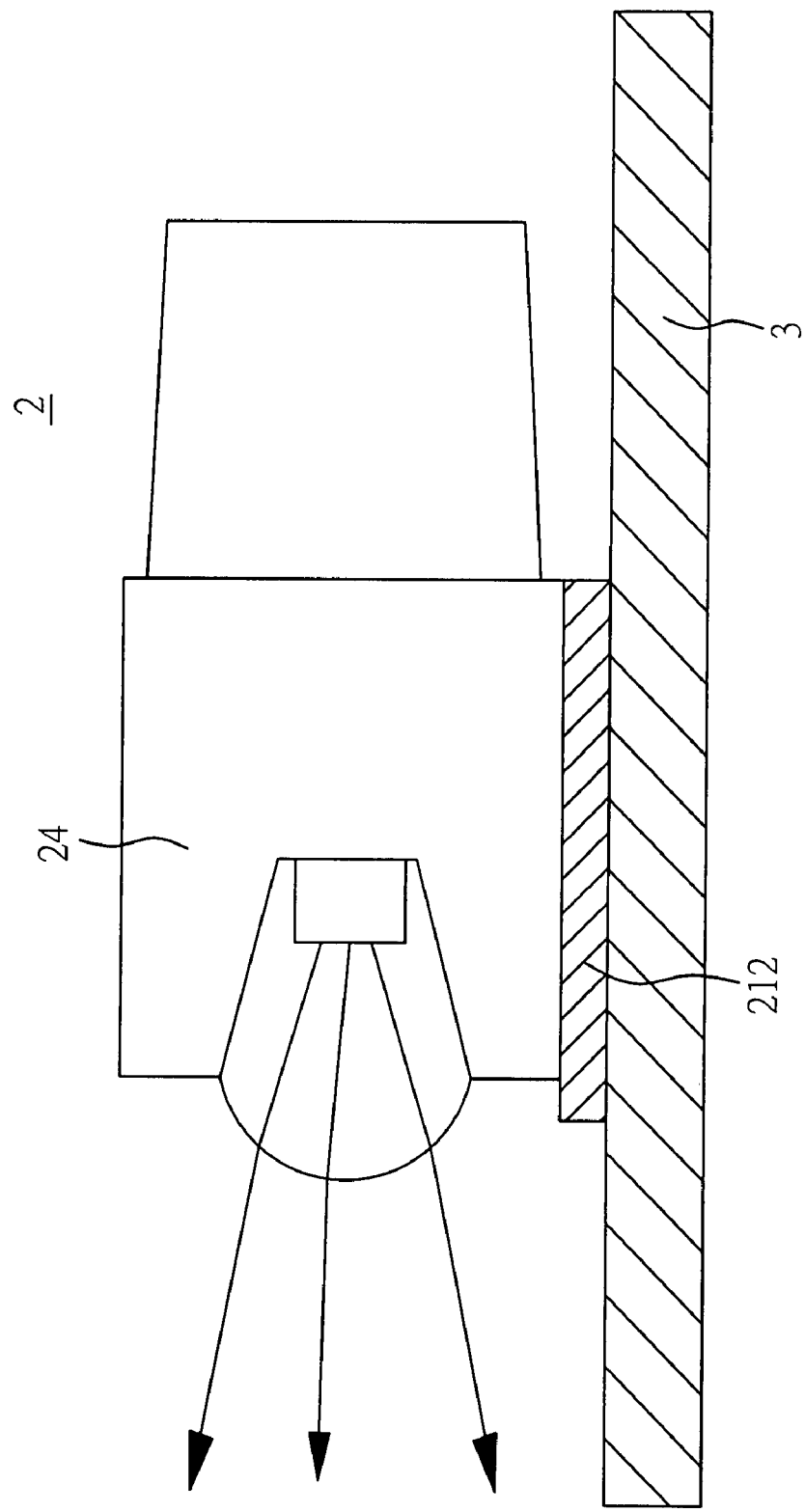
FIG. 7 is a schematic view showing a construction of the side view light emitting diode of the present invention connected to a substrate.

A contact portion 212 is formed by each of both lead-frames 21 and 22 at where they are exposed out of the casing 24 as illustrated in FIG. 3. The contact portion 212 directly achieves electric connection with a substrate 3 for the light emitting diode 2 to become a top view light emitting diode; or as illustrated in FIG. 6, each of both lead-frames 21 and 22 at where they are exposed out of the casing 24 is formed with a folded portion 211 and the contact portion 212 for each contact portions 212 being disposed to a side of the casing 24 by means of the folded portion 211 for the light emitting diode 2 to be electrically connected to the substrate 3 by means of both contact portions 212 respectively provided on two opposite sides of the casing 24 for the light emitting diode 2 to become a side view light emitting diode as illustrated in FIG. 7.

Figure 8:
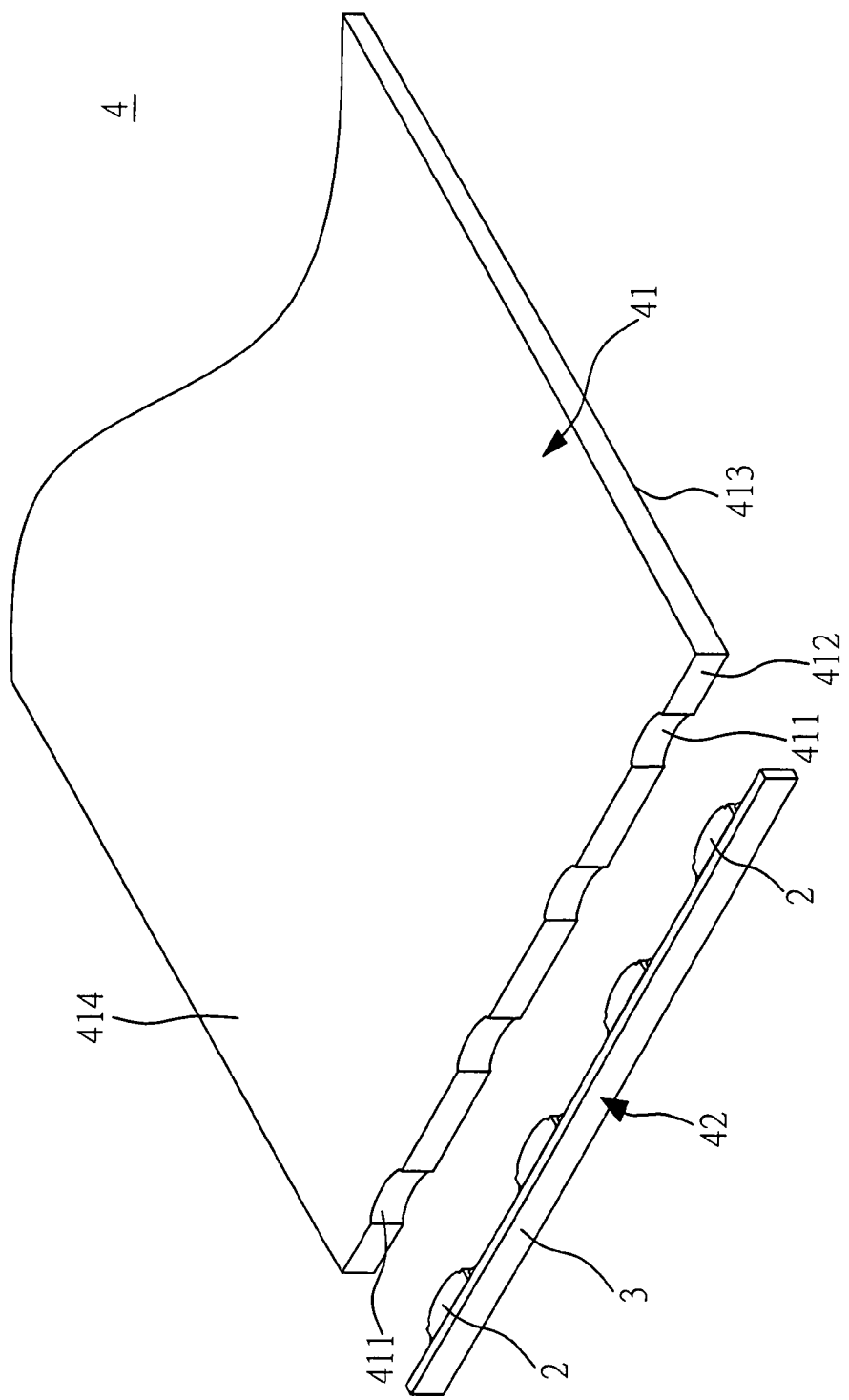
FIG. 8 is a perspective view showing a backlight module of a first preferred embodiment of the present invention.

When the light emitting diode of the present invention is applied in a backlight module as illustrated in the first preferred embodiment of the present invention in FIG. 8, a backlight module 4 includes a light guide plate 41 and a light source 42. The light source is provided with multiple light emitting diodes 2 and the substrate 3 with those light-emitting diodes 2 placed on the substrate 3. One side of the light guide plate 41 is disposed with multiple recesses 411 to allow insertion in place by each respective light emitting diode 2 thus for the light emitted form the light source 42 to enter from a side of the light guide plate 41.

Figure 9:
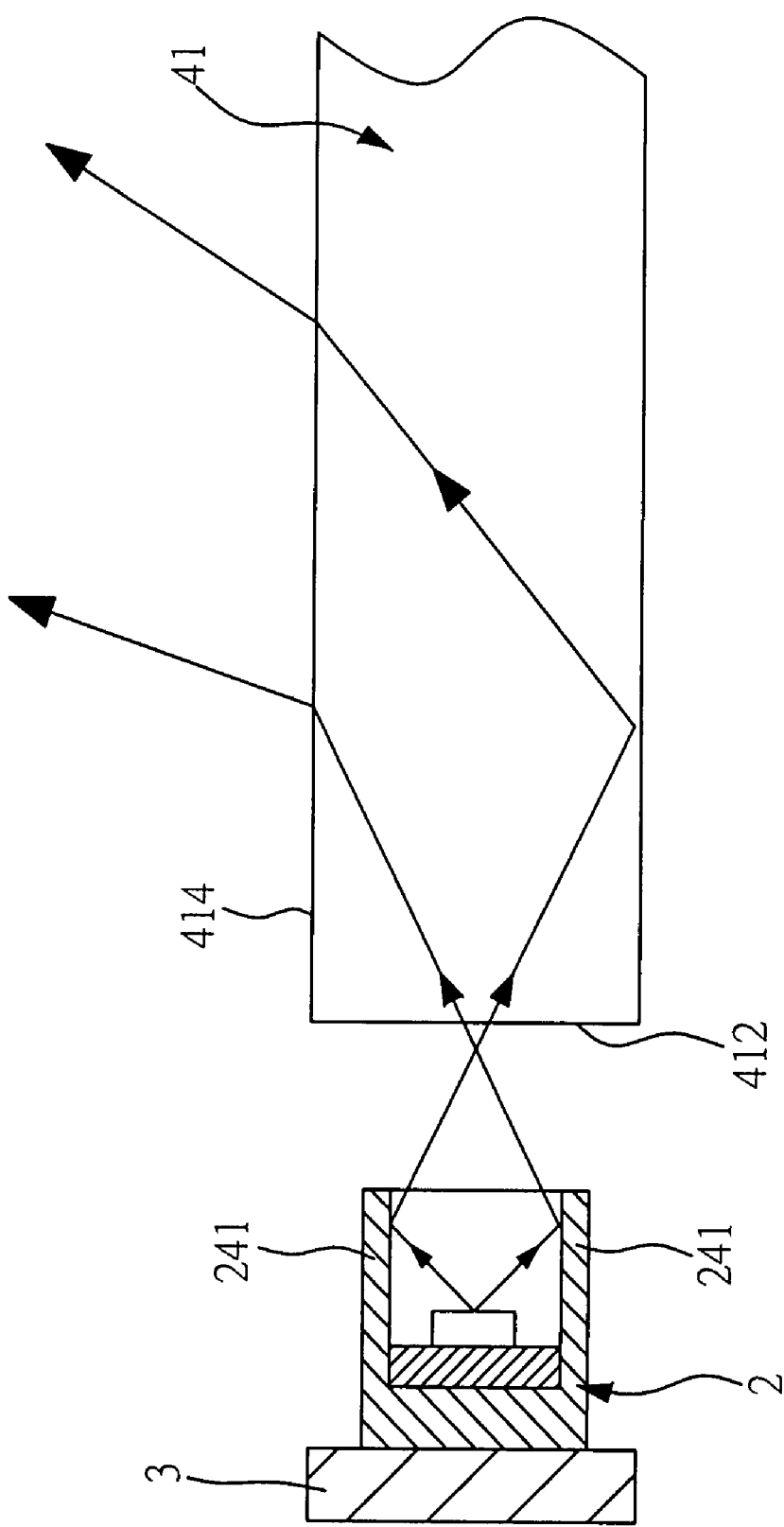
FIG. 9 is a schematic view showing the backlight module of the first preferred embodiment of the present invention.
Figure 10:
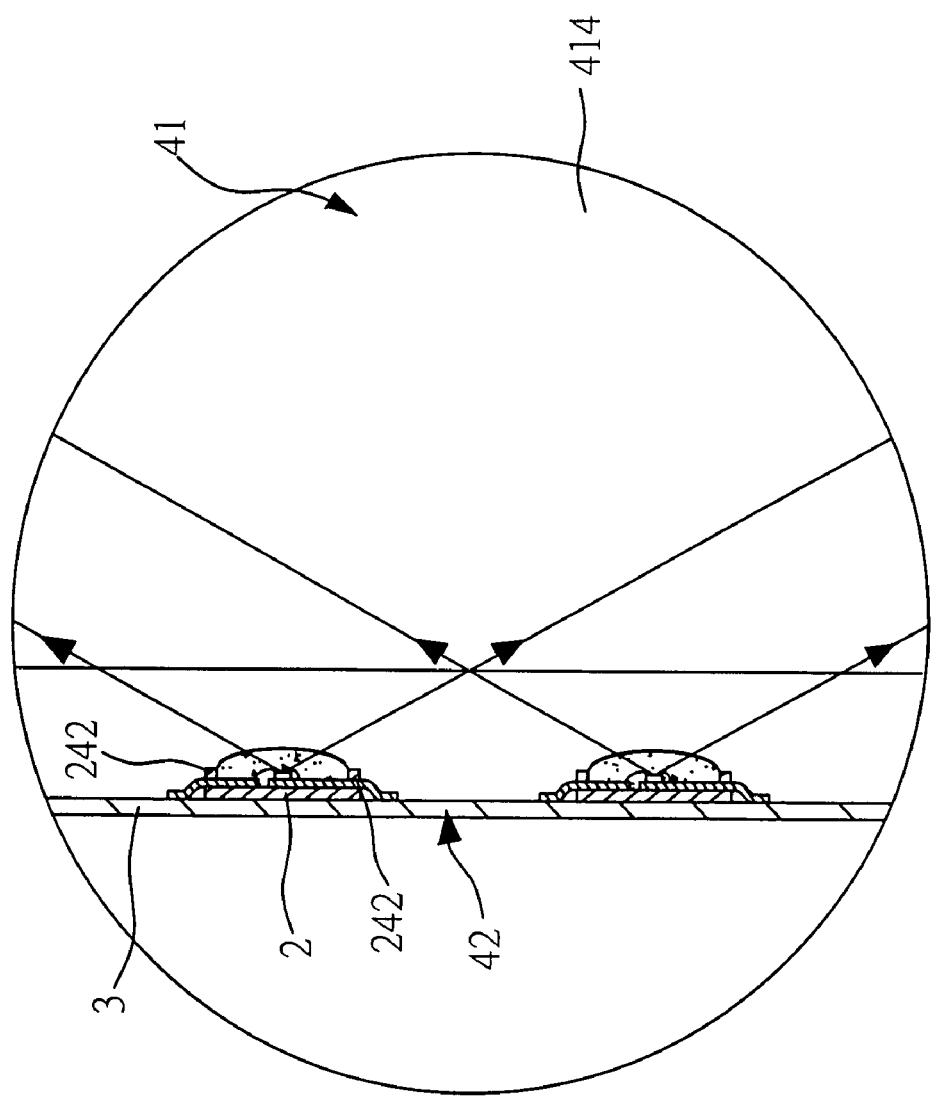
FIG. 10 is a schematic view showing another construction of the backlight module of the first preferred embodiment of the present invention.

The light guide plate 41 includes a light input plane 412, a base plane 413 crossing with the light input plane 412, and a light output plane 414 opposite to the base plane 413. As illustrated in FIGS. 9 and 10, the light source is provided on one side of the light input plane 412 and the first side 241 of each light emitting diode 2 is in parallel with the light output plane 414 to permit the light is collected as reflected from the first side 241 to fall within an effective use range of the light output plane 412 and improve use efficiency of the light by means of the convex packaging colloid; furthermore, the light emitting angle is increased since the second side is vertical to the light output plane 414 so to lead out the constantly dispersed light out of the light guide plate 41 and directed to a liquid crystal display panel.

Figure 11:
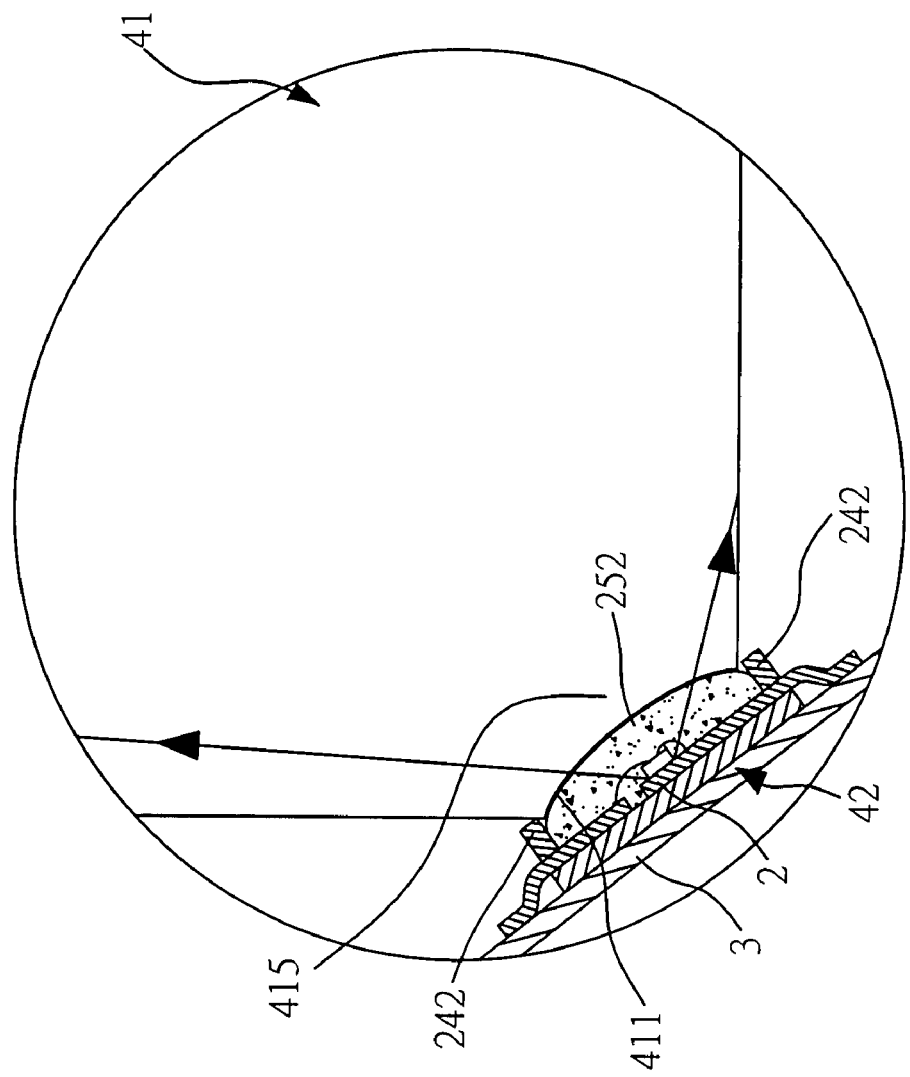
FIG. 11 is a perspective view showing a backlight module of a second preferred embodiment of the present invention.

In a second preferred embodiment of the backlight module of the present invention as illustrated in FIG. 11, a backlight module 4 also includes the light guide plate 41 and the light source 42. The light source 42 is disposed on a corner 415 of the light guide plate to achieve a corner light input. One or a plurality of corner 415 of the light guide plate 41 may be formed the corner light input. Multiple recesses 411 are also disposed on the corner 415 of the light guide plate 41 to secure each light emitting diode 2 inserted. Similarly, the light use efficiency is improved and the light emitting angle increased by means of each light emitting diode 2. The light emitting angle can be adjusted by taking advantage of the height formed by the second side 242 of the light emitting diode 2 towards the convex portion 252 thus to upgrade light use efficiency.

The prevent invention provides a light emitting diode to be applied in thinning device including a backlight module among others, and the application for a patent is duly filed emitting diode accordingly. However, it is to be noted that the preferred embodiments disclosed in the specification and the accompanying drawings are not limiting the present invention; and that any construction, installation, or characteristics that is same or similar to that of the present invention should fall within the scope of the purposes and claims of the present invention.

We claim:

1. A light emitting diode comprising two lead-frames, one or more light-emitting chips disposed on either of the lead-frames and electrically connected to the lead-frame with a conducting wire; a casing covering upon both the lead-frames and comprising a bottom wall and a first side unit and a second side unit opposite to each other with each of the side units including two sides, the first side unit and the second side unit extending from the bottom wall in a direction that is substantially perpendicular to the bottom wall, a compartment being surrounded by the first side unit and the second side unit; the second side unit being configured to have a height that is shorter than the height of the first side unit and is not zero along the direction that is substantially perpendicular to the bottom wall, so that the light directly emitted from the one or more light-emitting chips is substantially not incident onto the second side unit; and a packaging colloid received in the compartment.

2. The light emitting diode as claimed in claim 1, wherein the first side unit and the second side unit respectively relate to a longer side unit and a shorter side unit.

3. The light emitting diode as claimed in claim 1, wherein the packaging colloid protrudes from the casing to indicate a convex portion.

4. The light emitting diode as claimed in claim 1, wherein the packaging colloid includes a filling portion and a convex portion; the filling portion being received in the compartment; and the convex portion protruding out of the casing.

5. The light emitting diode as claimed in claim 4, wherein the contour of the first side unit is the same as that of the convex portion of the packaging colloid.

6. The light emitting diode as claimed in claim 1, wherein each of both the lead-frames is formed with a folded portion and a contact portion at where it is exposed out of the casing; and the contact portion is disposed to one side of the casing by means of the folded portion.

7. A backlight module comprising a light guide plate, one side of the light guide plate being disposed with a light source and the light source being comprised of multiple light emitting diodes as claimed in claim 1.

8. The backlight module as claimed in claim 7, wherein one side of the light guide plate is disposed with multiple recesses to receive insertion and secure in position of the respective light emitting diodes.

9. The backlight module as claimed in claim 7, wherein the multiple light emitting diodes are provided on a substrate.

10. The backlight module as claimed in claim 7, wherein the light guide plate includes a light input plane, a base plane crossing with the light input plane, and a light output plane opposite to the base plane; and the first side of the light emitting diode is parallel with the light output plane.

11. The backlight module as claimed in claim 7, wherein the first side unit and the second side unit respectively relate to a longer side unit and a shorter side unit.

12. The backlight module as claimed in claim 7, wherein the packaging colloid protrudes from the casing to indicate a convex portion.

13. The backlight module as claimed in claim 7, wherein the packaging colloid includes a filling portion and a convex portion; the filling portion being received in the compartment; and the convex portion protruding out of the casing.

14. The backlight module as claimed in claim 13, wherein the contour of the first side unit is the same as that of the convex portion of the packaging colloid.

15. A backlight module comprising a light guide plate; a corner of the light guide plate being disposed with a light source; and the light source being comprised of multiple light emitting diodes as claimed in claimed 1.

16. The backlight module as claimed in claim 15, wherein a corner of the light guide plate is disposed with multiple recesses to receive insertion and secure in position of their respective the light emitting diodes.

17. The backlight module as claimed in claim 15, wherein the first side unit and the second side unit respectively relate to a longer side unit and a shorter side unit.

18. The backlight module as claimed in claim 15, wherein the packaging colloid protrudes from the casing to indicate a convex portion.

19. The backlight module as claimed in claim 15, wherein the packaging colloid includes a filling portion and a convex portion; the filling portion being received in the compartment; and the convex portion protruding out of the casing.

20. The backlight module as claimed in claim 19, wherein the contour of the first side unit is the same as that of the convex portion of the packaging colloid.

* * * * *